(12) United States Patent
Young

(10) Patent No.: US 8,575,480 B2
(45) Date of Patent: Nov. 5, 2013

(54) CONNECTION ASSEMBLY

(75) Inventor: Dennis R. Young, Sheffield, OH (US)

(73) Assignee: Delta Systems, Inc., Streetsboro, OH (US)

( * ) Notice: Subject to any disclaimer, the term of this patent is extended or adjusted under 35 U.S.C. 154(b) by 229 days.

(21) Appl. No.: 13/097,199

(22) Filed: Apr. 29, 2011

(65) Prior Publication Data

US 2011/0265341 A1   Nov. 3, 2011

Related U.S. Application Data

(60) Provisional application No. 61/329,732, filed on Apr. 30, 2010.

(51) Int. Cl.
*H05K 5/00* (2006.01)

(52) U.S. Cl.
USPC ........... 174/50; 701/103; 340/691.1; 248/463

(58) Field of Classification Search
USPC .......... 701/29, 70, 38, 103, 45; 340/440, 429, 340/691.1; 439/310, 638, 136, 502, 275; 400/88; 174/50, 350, 252, 261, 75 R, 174/45; 361/818, 679.01, 679.33, 679.3, 361/679.37, 679.48, 679.49, 679.6, 679.06, 361/679.09, 679.55; 248/220.22, 206.2, 248/442.2, 205.3, 918, 487, 463
See application file for complete search history.

(56) References Cited

U.S. PATENT DOCUMENTS

| 3,702,051 | A | 11/1972 | Deines |
| 5,532,672 | A | 7/1996 | Plazarin |
| 5,742,228 | A | 4/1998 | Levy |
| 5,797,111 | A | 8/1998 | Halasz et al. |
| 6,442,018 | B1 * | 8/2002 | Dinkin ................... 206/305 |
| 6,916,128 | B1 * | 7/2005 | Petteruti et al. ............. 400/88 |
| 6,983,583 | B2 | 1/2006 | Bucher |
| 7,373,801 | B2 | 5/2008 | Friedman et al. |
| 7,641,234 | B1 | 1/2010 | Pelnar |
| 7,777,639 | B2 | 8/2010 | Young et al. |
| 7,950,268 | B2 | 5/2011 | Friedman et al. |
| 2003/0102178 | A1 | 6/2003 | Ide et al. |
| 2005/0004730 | A1 | 1/2005 | Suzuki et al. |
| 2005/0080544 | A1 | 4/2005 | Suzuki et al. |
| 2005/0108999 | A1 | 5/2005 | Bucher |
| 2005/0217230 | A1 | 10/2005 | Bucher |

(Continued)

FOREIGN PATENT DOCUMENTS

JP      2005205960 A      8/2005

OTHER PUBLICATIONS

International Search Report (14 pages) for App. EP10150894, mailing date Jun. 30, 2010.

(Continued)

*Primary Examiner* — Hung Duong
(74) *Attorney, Agent, or Firm* — Tarolli, Sundheim, Covell & Tummino LLP

(57) ABSTRACT

A connection assembly for securing electrical components used with power equipment comprises a housing and connector cover forming an upper arrangement of the connection assembly. The housing and connector cover form a cavity therebetween for supporting electronics disposed within the cavity. The connection assembly also comprises a lower arrangement used to secure the connection assembly to a surface of a power equipment device and a hinge assembly that forms a rotational connection between the upper arrangement and the lower arrangement.

20 Claims, 19 Drawing Sheets

(56) References Cited

U.S. PATENT DOCUMENTS

2010/0114435 A1    5/2010  Boylston et al.
2010/0191408 A1    7/2010  Boylston et al.
2011/0265341 A1   11/2011  Young
2012/0208387 A1*   8/2012  Takeda .......................... 439/310

OTHER PUBLICATIONS

Powers, et al., "Preventing tractor rollover fatalities: performance of the NIOSH AutoROPS", Injury Prevention, 7 (Suppl I): i-54-58 (2001).

* cited by examiner

CONNECTION ASSEMBLY

CROSS REFERENCES TO RELATED APPLICATIONS

The following application claims priority to co-pending U.S. Provisional Patent Application Ser. No. 61/329,732 filed Apr. 30, 2010 entitled CONNECTION ASSEMBLY. The above-identified application from which priority is claimed is incorporated herein by reference in its entirety for all purposes.

TECHNICAL FIELD

The present disclosure relates to connection assembly for securing electrical components, and more specifically, a connection assembly for use with electrical components in power equipment.

BACKGROUND

Power equipment that includes for example, lawn and garden tractors, all terrain vehicles (ATVs), and the like are offering more accessories and features as technology evolves. Such accessories and features include, for example, tilt sensing equipment and electronics that measure the inclination of the garden tractor during operation. One example is described in further detail in U.S. patent application Ser. No. 12/686,722 that was filed on Jan. 13, 2010 entitled TILT AND/OR ACCELERATION SENSING APPARATUS AND METHOD that published under U.S. Patent Publication No. 2010/0191408 on Jul. 29, 2010 and assigned to the assignee of the present disclosure. The TILT/ACCELERATION U.S. Patent Application identified above (hereinafter "the '722 Application") is incorporated herein by reference in its entirety for all purposes.

Another example of such technology is also described in U.S. patent application Ser. No. 12/261,291 that was filed on Oct. 30, 2008 entitled TILT SENSOR ASSEMBLY AND METHOD that was published under U.S. Patent Publication No. 2010/0114435 on May 6, 2010 (hereinafter "the '291 Application"). The '291 Application is assigned to the assignee of the present and is incorporated herein by reference in its entirety for all purposes.

As more features and accessories are being offered, the amount of electronics required to support such features and accessories increases. On power equipment, especially on the type that traverses rugged terrain such as a garden tractor, maintaining the interconnection between electrical components is important. Also important is the need to minimize resonance or vibration in the electronics during the operation of the power equipment. Such achievements reduce quality issues, malfunctioning of the electronics, warranty claims, and provide a longer product life cycle.

SUMMARY

One example embodiment of the present disclosure includes a connection assembly for securing electrical components used with power equipment. The connection assembly comprises a housing and connector cover forming an upper arrangement of the connection assembly. The housing and connector cover further form a cavity therebetween that supports electronics disposed within the cavity. The connection assembly also comprises a lower arrangement used to secure the connection assembly to a power equipment device and a hinge assembly that forms a rotational connection between the upper arrangement and the lower arrangement.

Another example embodiment of the present disclosure includes a connector assembly for use with a power equipment device. The connector assembly comprises an upper arrangement comprising a housing having a cavity for supporting electronics and a lower arrangement for securing the connector assembly to a surface on a power equipment device. The connector assembly further comprises a hinge assembly that includes a rotational connection between the upper arrangement and the lower arrangement. The connector assembly also comprises an isolation assembly formed between the upper arrangement and lower arrangement such that when the upper arrangement and lower arrangement are rotated by the hinge assembly to a closed position, the isolation assembly is in solid contact between the upper and lower arrangements.

While another example embodiment of the present disclosure includes a connector assembly for use with a lawn tractor. The connector assembly comprises an upper arrangement comprising a housing and a connector cover having a cavity for supporting electronics and a lower arrangement for securing the connector assembly to a surface of a lawn tractor. The connector assembly further comprises a hinge assembly forming a rotational connection between said upper arrangement and said lower arrangement. The connector assembly also comprises an isolation assembly formed within said upper arrangement and lower arrangement such that when said upper arrangement and lower arrangement are rotated by said hinge assembly to a closed position, the isolation assembly generates solid contact between the upper and lower arrangements. The isolation assembly comprises at least one annular projection surrounded by a damper extending from said lower arrangement and a boss for contacting said damper extending from the said upper arrangement. The boss and damper are in contact when said upper and lower arrangements are rotated about said hinge assembly to a closed position, the isolation assembly forming a positive contact between the upper and lower arrangements when the connection assembly is in said closed position.

BRIEF DESCRIPTION OF THE DRAWINGS

The foregoing and other features and advantages of the present disclosure will become apparent to one skilled in the art to which the present disclosure relates upon consideration of the following description of the invention with reference to the accompanying drawings, wherein like reference numerals, unless otherwise described refer to like parts throughout the drawings and in which.

DETAILED DESCRIPTION

Referring now to the figures generally wherein like numbered features shown therein refer to like elements throughout unless otherwise noted. The present disclosure relates generally to a connection assembly for securing electrical components, and more specifically, a connection assembly for use with electrical components in power equipment.

Power equipment or a power equipment device includes any product that utilizes one or more electrical connections. Power equipment or a power equipment device also includes any product that may require calibration of one or more sensors. Suitable examples of power equipment and power equipment devices include, but are not limited to, mobile vehicles, land vehicles, water vehicles, air vehicles, water crafts, fork trucks, tractors, lawn tractors, skid steer vehicles, go-carts, golf carts, all terrain vehicles ("ATVs"), snow mobiles, motor cycles, scooters, cars, buses, school buses, trucks, recreational vehicles, bull dozers, ambulances, fire trucks, trains, trolleys, subway trains, boats, hydroplanes, jet skis, planes, ultra-lites, chain saws, weed wackers, push lawn mowers, elevators, escalators, shrub trimming shears, excavating equipment, push and self propelled mowers, snow blowers, rototillers, cultivators, power grass edgers, and the like.

Figure 1A:
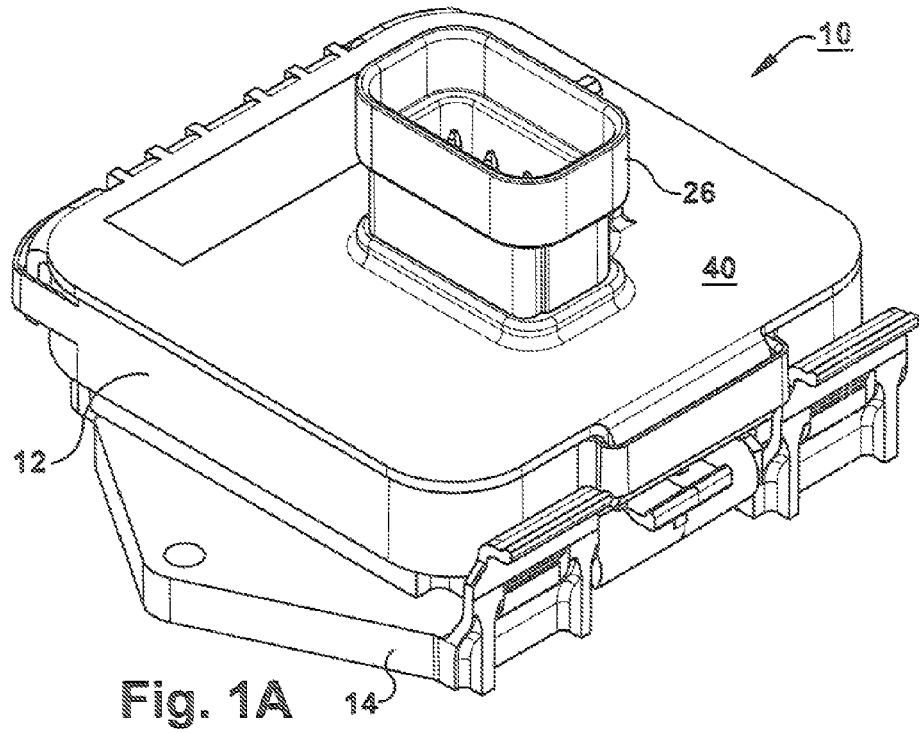
FIG. 1A is a first perspective view of a connection assembly and apparatus constructed in accordance with one example embodiment of the present disclosure.
Figure 1B:
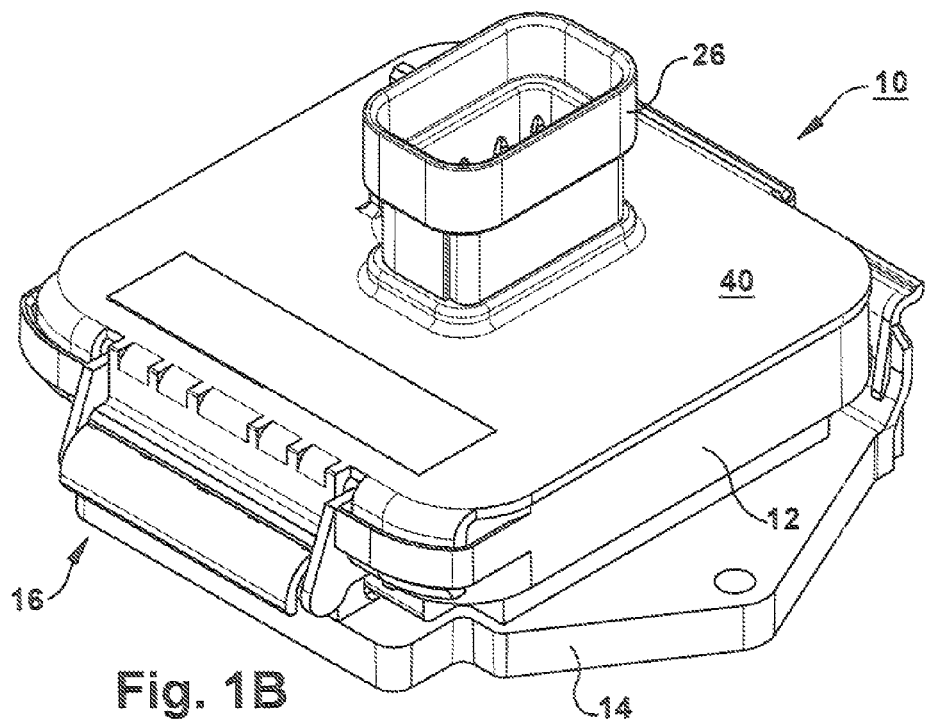
FIG. 1B is a second perspective view of a connection assembly and apparatus illustrated in FIG. 1A.
Figure 1C:
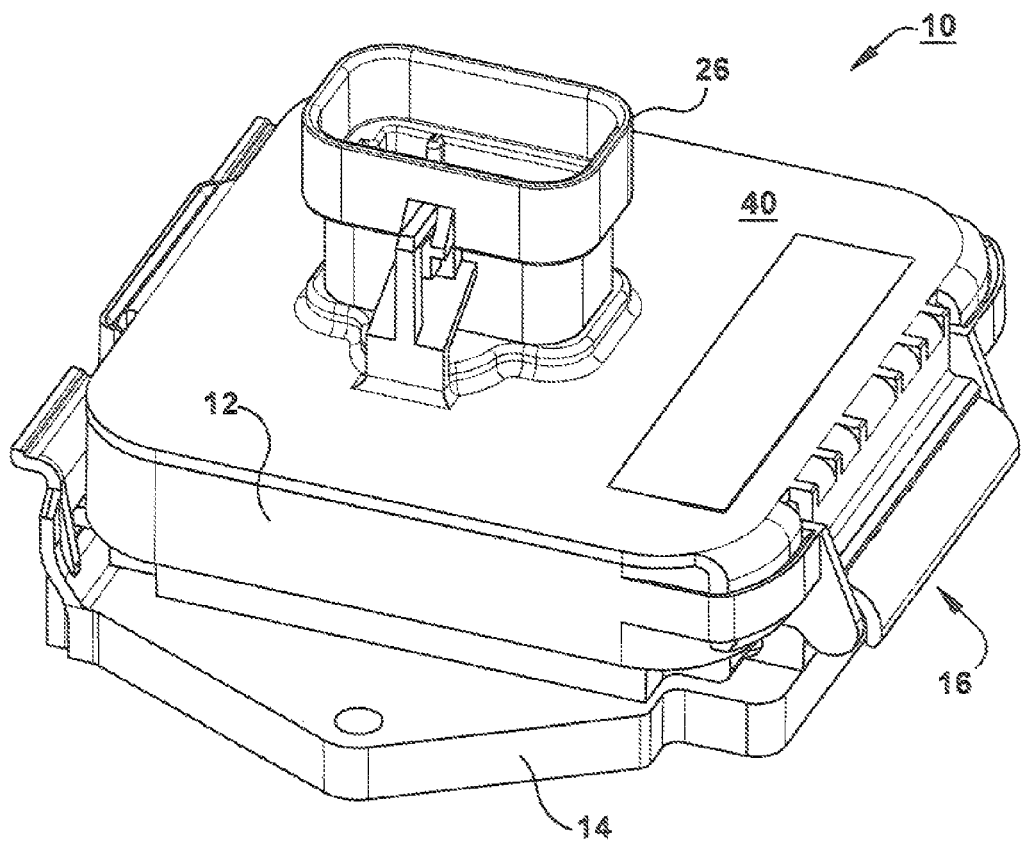
FIG. 1C is a third perspective view of a connection assembly and apparatus illustrated in FIGS. 1A and 1B.
Figure 2:
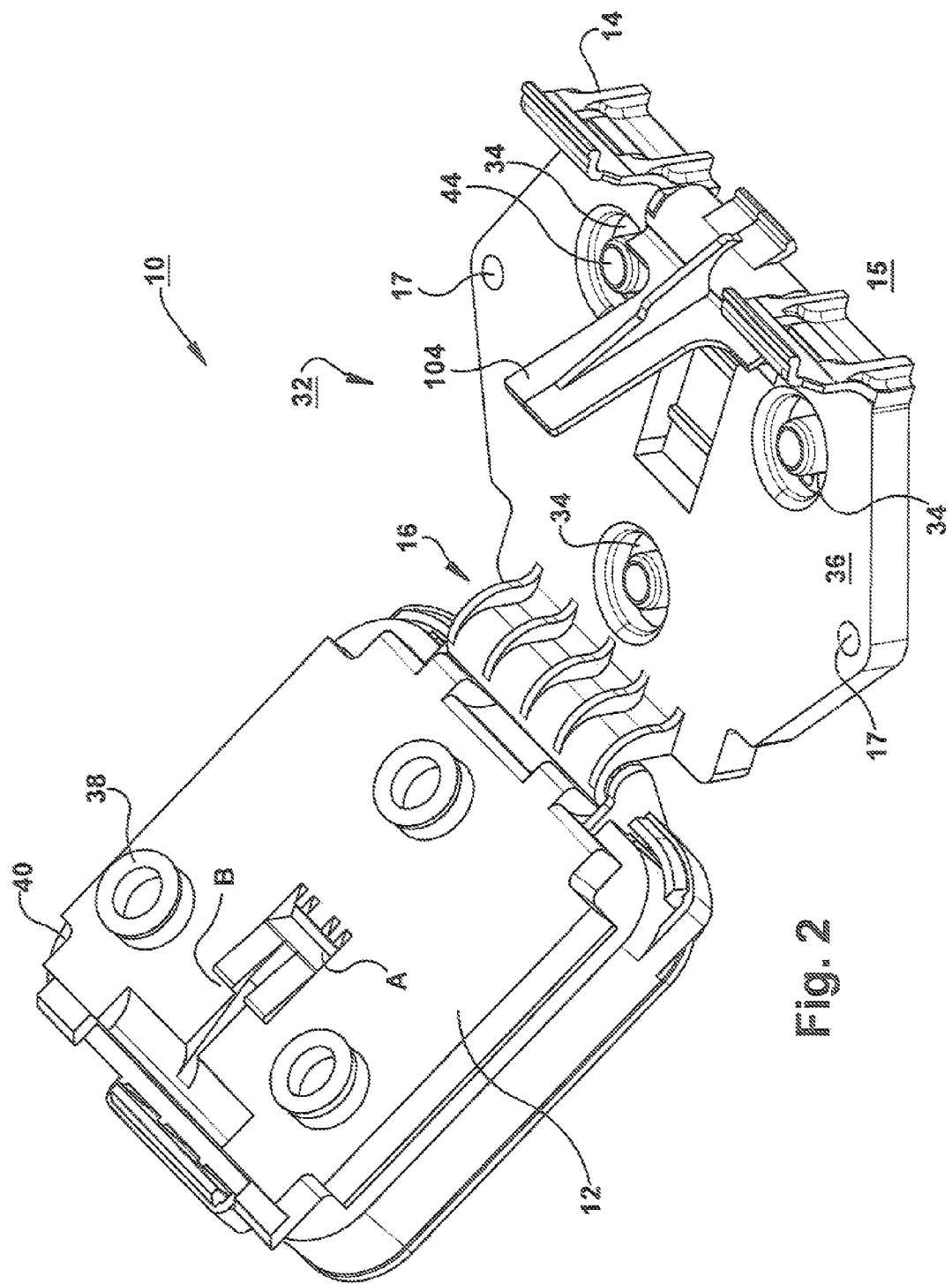
FIG. 2 is an open perspective view of a connection assembly and apparatus illustrated in FIGS. 1A, 1B, and 1C.

Referring now to the figures in detail and in particular to FIGS. 1A, 1B, 1C, and 2 are perspective views of a connection assembly and apparatus 10 constructed in accordance with one exemplary embodiment of the present disclosure. In FIG. 2, the connection assembly 10 is in an opened position. In FIGS. 1A, 1B, and 1C, the connection assembly 10 is in a closed, locked, or secured position.

The connection assembly 10 comprises a housing 12 rotatably connected to a mount plate 14 about a hinge pin assembly 16. The mount plate 14 is secured at an attachment point 15 (see FIGS. 2 and 19-20) to the power equipment typically along the frame, chassis, body, or engine. In one example embodiment, the mount plate 14 is secured to the attachment point 15 through mechanical fasteners such as screws or bolts through apertures 17 (see FIG. 2).

Figure 7:
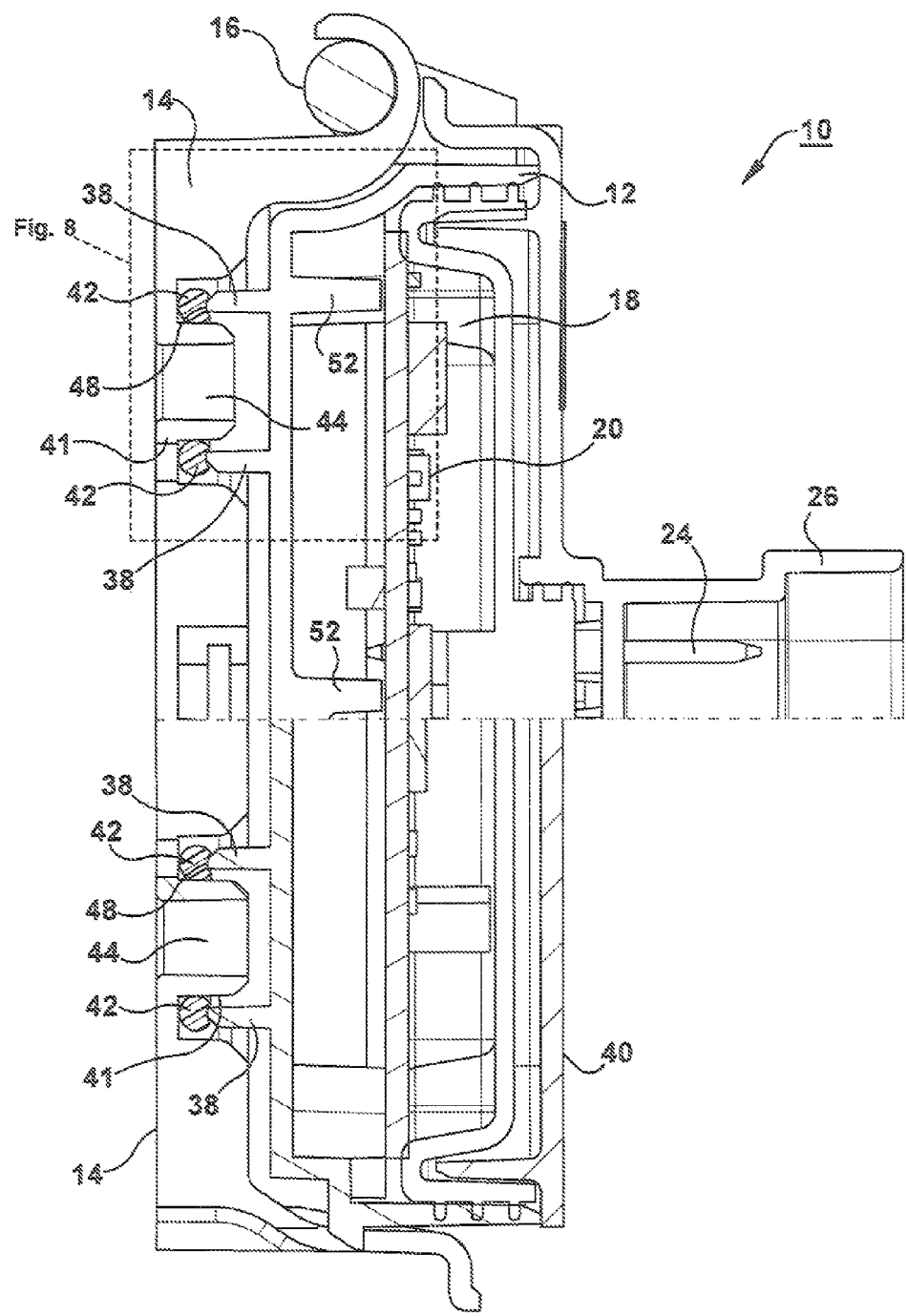
FIG. 7 is an elevated section view of the connection assembly of the example embodiment of FIG. 6 along section lines 7-7.
Figure 9:
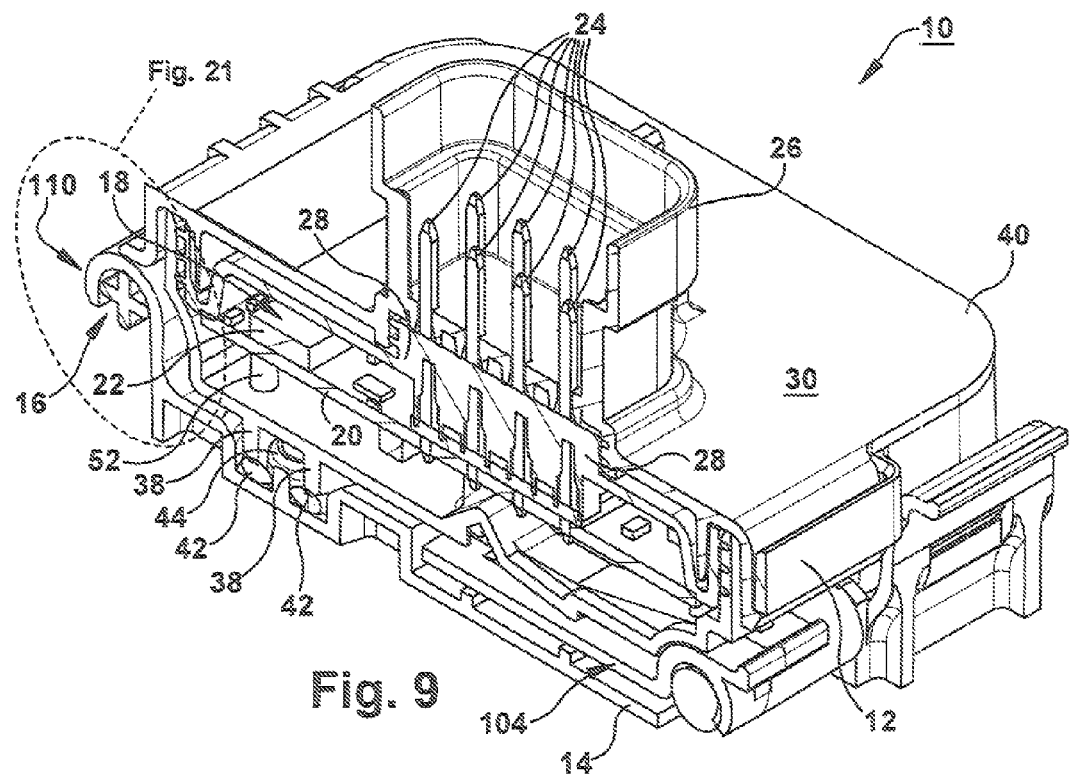
FIG. 9 is an isometric sectional view of the connection assembly of the example embodiment of FIG. 3 along section lines 9-9.
Figure 10:
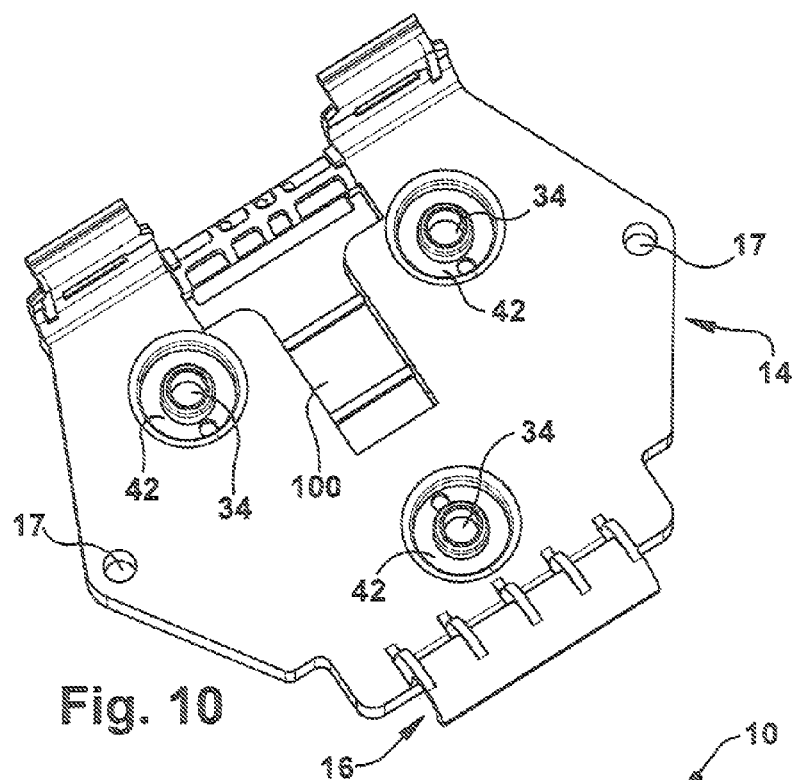
FIG. 10 is a plan view of an inner surface of a mounting plate constructed in accordance with one example embodiment of the present disclosure.
Figure 11:
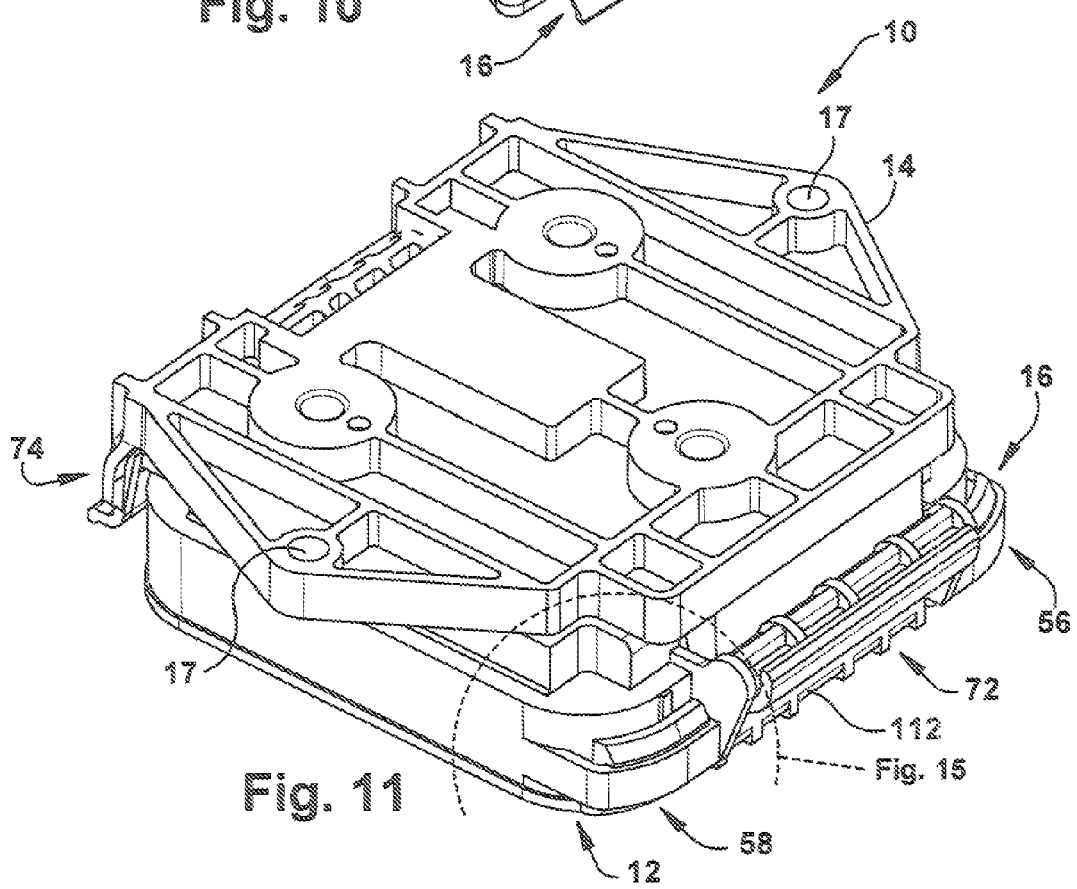
FIG. 11 is a perspective bottom view of a connection assembly and apparatus constructed in accordance with one example embodiment of the present disclosure.

As best seen in the elevated section view of FIGS. 7 and 9, the housing 12 comprises a cavity 18 supporting a printed circuit board ("PCB") 20. Connected to and/or forming part of the PCB 20 is any combination of an application specific integrated circuits (ASIC), micro devices, processor(s), and other electronic components, (collectively "electronics 22") designed to operate a particular feature or accessory associated with intended power equipment.

In the illustrated example embodiment of FIGS. 7 and 9, the PCB 20 includes two rows of pin connectors 24 projecting upward into a connecting port 26 extending from an outer surface 30 of a connector cover 40 for engaging a wiring harness (not shown). In one example embodiment, the pins 24 pass through a gasket or seal 28 that reduces the risk of moisture or debris from entering the cavity 18 and harming the electronics 22. The pin connectors 24 provide or receive data and/or power to the electronics 22.

In the illustrated example embodiment, the seal 28 is made from silicone having a relative durometer hardness of approximately 45 on a shore A scale. The seal 28 forms a moisture and debris free area within the housing 12 while allowing the pins 24 to pass from the interior to the exterior of the housing. The seal 28 could be formed from any elastomeric material having similar sealing characteristics without departing from the spirit and scope of the claimed disclosure.

In one example embodiment, the seal 28 is a seal similar to the seal shown in U.S. patent application Ser. No. 11/956,409 that was filed on Dec. 14, 2007 entitled INDICATOR DISPLAY MODULE that published under U.S. Patent Publication No. 2009/0153314 on Jun. 18, 2009 and issued as U.S. Pat. No. 7,777,639 on August 2010 (hereinafter "the '639 Patent"). The '639 Patent is assigned to the assignee of the present disclosure and is incorporated herein by reference in its entirety for all purposes.

In the exemplary embodiment of FIGS. 1A, 1B, 1C, and 2, the housing 12, mount plate 14, and hinge pin assembly 16 are formed from generally plastic and more specifically a thermoplastic material. However, equivalent materials of similar strength and/or weight could be used without departing from the spirit and scope of the present disclosure.

Because conventional electrical connectors for power equipment are typically designed with clearances in order to properly fit and function, vibration in combination with such clearances may result in damage to the plastic components and any housed electronics within the connectors. Such damage and vibration experienced in conventional electrical connectors is minimized by the advancements of connector assembly 10 presented in the present disclosure.

One such advancement of the connector assembly 10 of the present disclosure used to mitigate vibration to the electronics 22 comprises an isolation assembly 32, as illustrated in FIGS. 2, 7, 8, and 10. The isolation assembly 32 comprises a plurality of isolation pockets 34 molded and recessed into an inner surface 36 of the mount plate 14, bosses 38 molded into and projecting from the housing 12, and dampeners 42.

Figure 8:
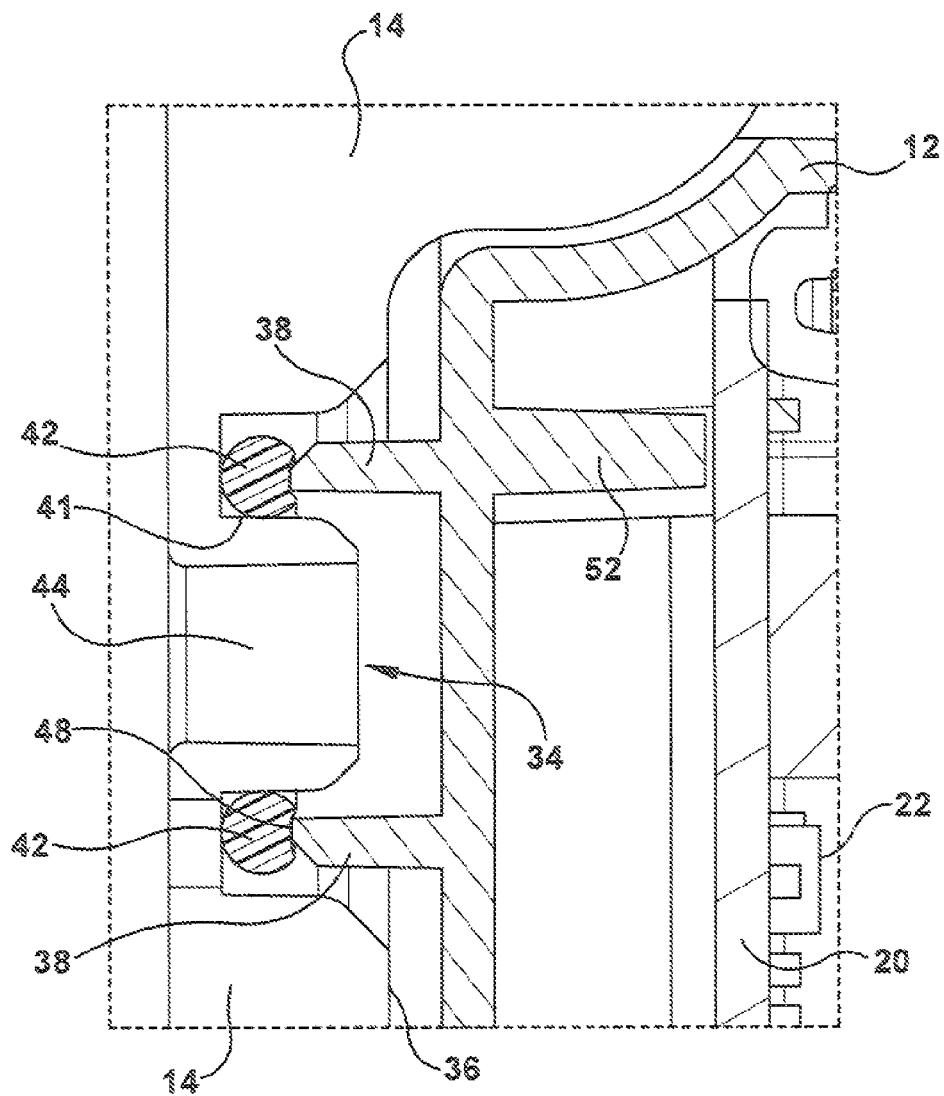
FIG. 8 is a magnified view of a portion shown in the example embodiment of FIG. 7.

Each of the isolation pockets 34 comprises an annular projection 44 (see FIG. 8) extending away from the respective pocket toward, but below the inner surface 36 when the connector assembly 10 is in a closed position as shown in FIGS. 8 and 9. Each annular projection 44 has an outer diameter 41 around which the inner diameter of a ring-shaped dampener 42 is nested. In one example embodiment, the ring-shaped dampener 42 is an o-ring made from a flexible material. Rubber, neoprene, and pliable polymeric compounds are examples of suitable materials used to form the o-ring or ring-shaped dampener 42.

During pivotal rotation of the hinge pin assembly 16, the housing 12 advances toward the mount plate 14 such that each boss of the plurality of bosses 38 aligns for contact with a respective isolation pocket of the plurality of isolation pockets 34 when the connection assembly 10 is in a closed position. As a result, an annular ridge 48 on each respective boss 38 makes contact with a respective ring-shaped dampener 42 as illustrated in the example embodiment of FIG. 8.

During operation, the ring-shaped dampeners 42 are used as both isolators and dampening devices within the connection assembly 10 to prevent damage to the enclosed PCB 20 and/or electronics 22. Additionally, the ring-shaped dampeners 42 facilitate in the reduction of excess clearances between mating components in the housing 12 and mount plate 14, such that induced or operational vibrations experienced in the power equipment will not cause damage to the electronics 22 or PCB 20.

As illustrated in FIGS. 8 and 9, the ring-shaped dampeners 42 are assembled into individual isolation pockets 34 within the mount plate 14. The dampeners 42 are then annularly compressed by the respective bosses 38 when the housing 12 is secured to the mount plate 14 by a latching assembly 50 (see FIGS. 2 and 14). The compression of the dampeners 42 results from the engagement of the respective bosses 38 as the bosses extrude into the isolation pockets 34. The dimensional stack-up of the bosses 38 and their engagement with the compressed height of the dampeners 42 in the illustrated closed or secured position example embodiment of FIGS. 1A and 8 is shown with maximum allowable clearances associated with the tolerances of the bosses and dampeners. Stated another way, even at the maximum distance allowed on all tolerances in the connection assembly 10, the bosses 38 still compress the dampeners 42 when the assembly is closed.

Because power equipment typically traverses undulating terrain, the electrical components and connections are exposed to ongoing vibration. Conventional electrical connectors for power equipment are designed to attach numerous plastic components together, but are susceptible to separation or unlatching without the use of tools or when exposed to the ongoing vibration of the power equipment. In addition, tampering with the electrical connections of conventional electronic connectors can occur without detection, concealing activity that may void warranty contracts or result in costly repairs. The unlatching during use from vibration and concealed tampering conditions permitted in typical conventional electrical connectors is minimized by the advancements presented in the connector assembly 10 of the present disclosure.

One such advancement of the present disclosure used to mitigate the unlatching during use of the connection assembly 10 and concealed tampering conditions is the latching assemblies 50 illustrated in FIGS. 2, 4, 9 and 11-18. The latching assemblies 50 secure the connector cover 40 to the housing 12. The housing 12 helps form the cavity 18 and supports the PCB 20 through projections 52 extending into the cavity 18 as seen in FIG. 9.

Figure 3:
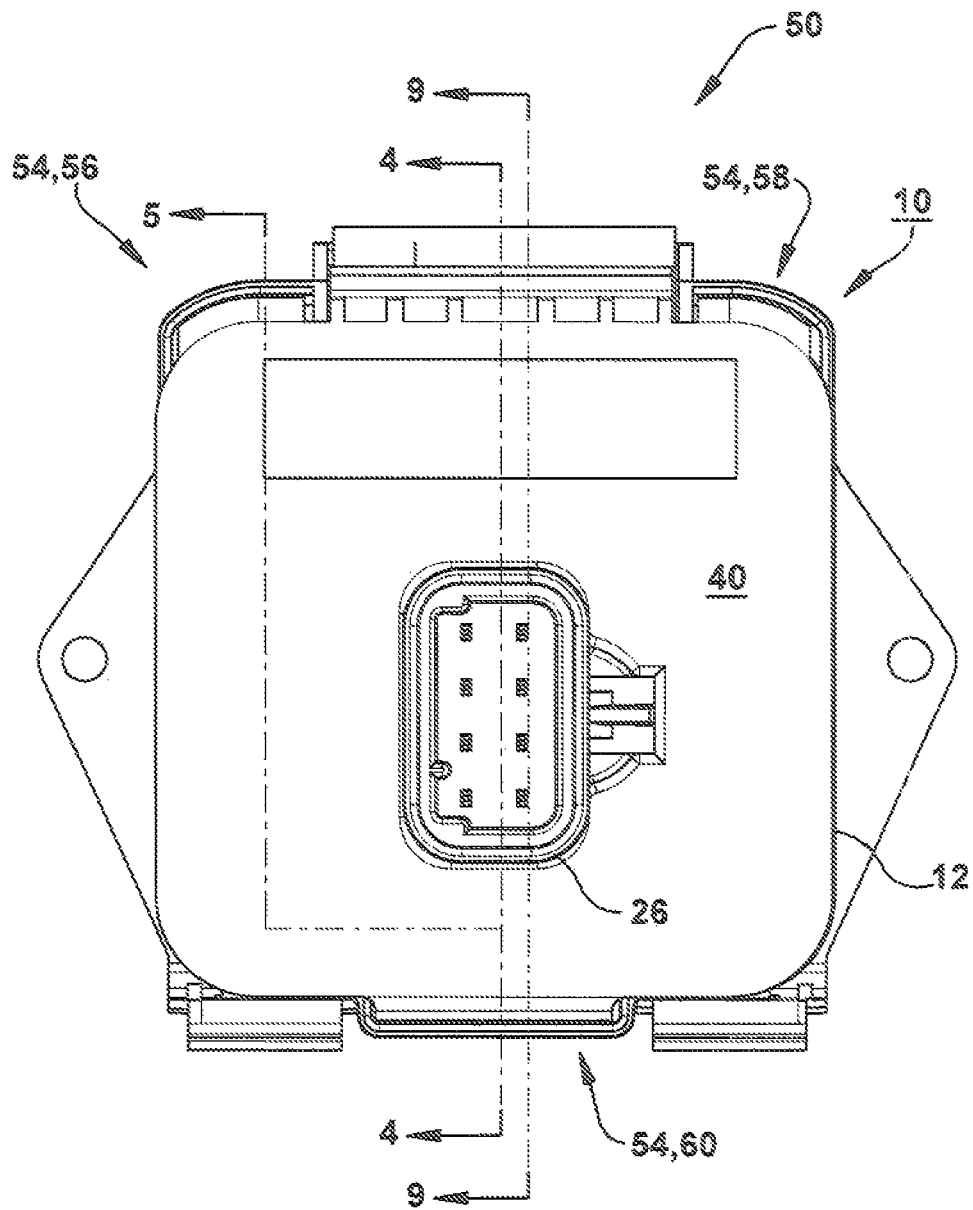
FIG. 3 is an upper plan view of a connection assembly and apparatus illustrated in FIGS. 1 and 2.

The latching assemblies 50 comprise three snap arrangements 54 integrated into the connector cover 40 for securing the housing 12 to the connector cover (see for example FIG. 3). The snap arrangements 54 include first and second corner snap arrangements 56 and 58, respectively as illustrated in FIGS. 3, 4, 11, 13-14 and 15. The snap arrangements 54 further comprise an edge snap arrangement 60 as illustrated in FIGS. 3, 12 and 16.

The first and second corner snap arrangements 56 and 58, respectively comprise a double arcuate leg 62 of the connector cover 40 curving up through and around an arcuate slot 68 formed by an arcuate ridge 66 of the housing 12 along the curved perimeters 70 at a front end 72 of the connector assembly 10. Disposed along the distal end of the arcuate leg 62 is an arcuate pawl 64 that locks the leg within the arcuate slot 68. The locking condition is achieved by a limb 63 passing over an edge 65 of the arcuate slot 68.

Figure 14:
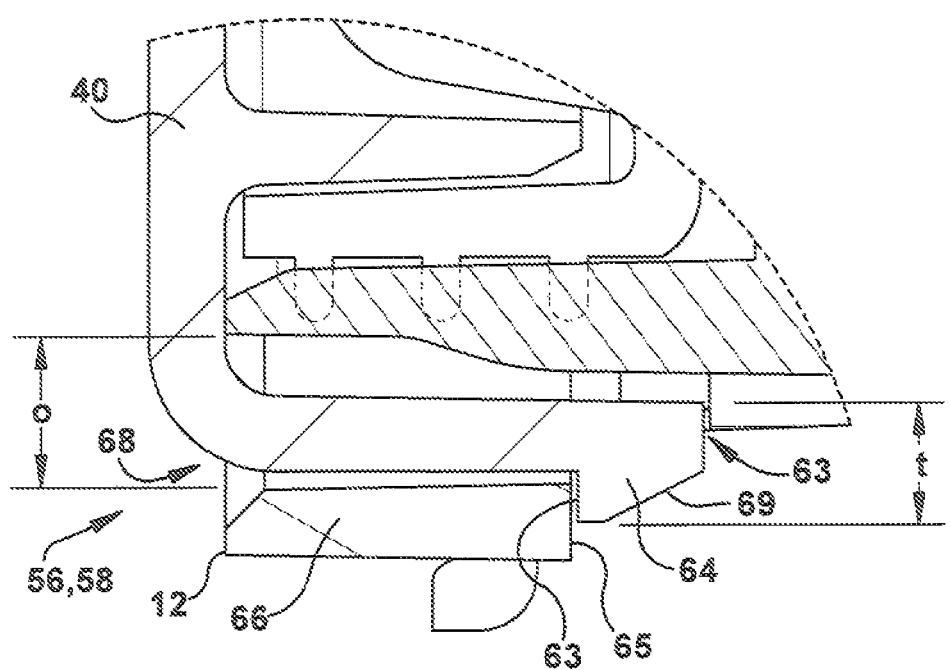
FIG. 14 is a magnified view of a portion of the example embodiment shown in FIG. 4.
Figure 15:
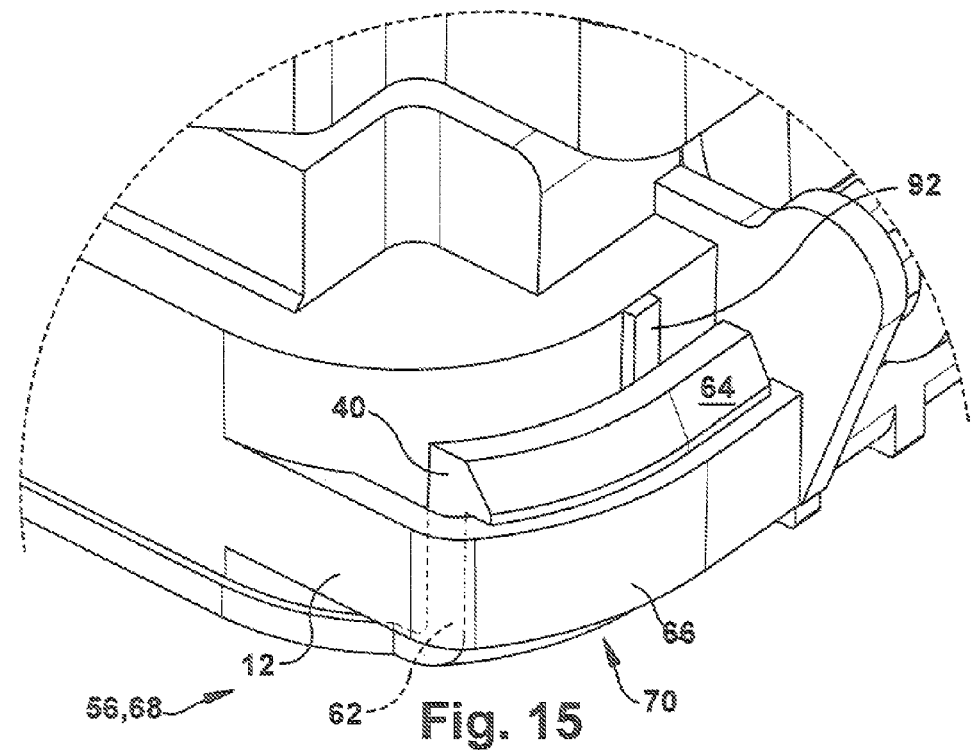
FIG. 15 is a magnified view of a portion of the example embodiment shown in FIG. 11.

The thickness "t" of the pawl 64 is greater than the opening "o" formed by the arcuate slot 68, facilitating the locking arrangement illustrated in FIG. 14. Advancement of the arcuate leg 62 and pawl 64 during insertion into the arcuate slot 68 is facilitated by an arcuate inclined plane 69 surrounding the pawl. Because the thickness of the pawl 64 is greater than the opening "o", the pawl and a portion of the housing 12 forming the slot elastically deform temporarily during insertion. Material may also scrape away from the pawl 64 during insertion as well due to the press-fit connection between the arcuate slot 68 and pawl that is further created by the biasing of one or more ribs 92 against the pawl.

Figure 12:
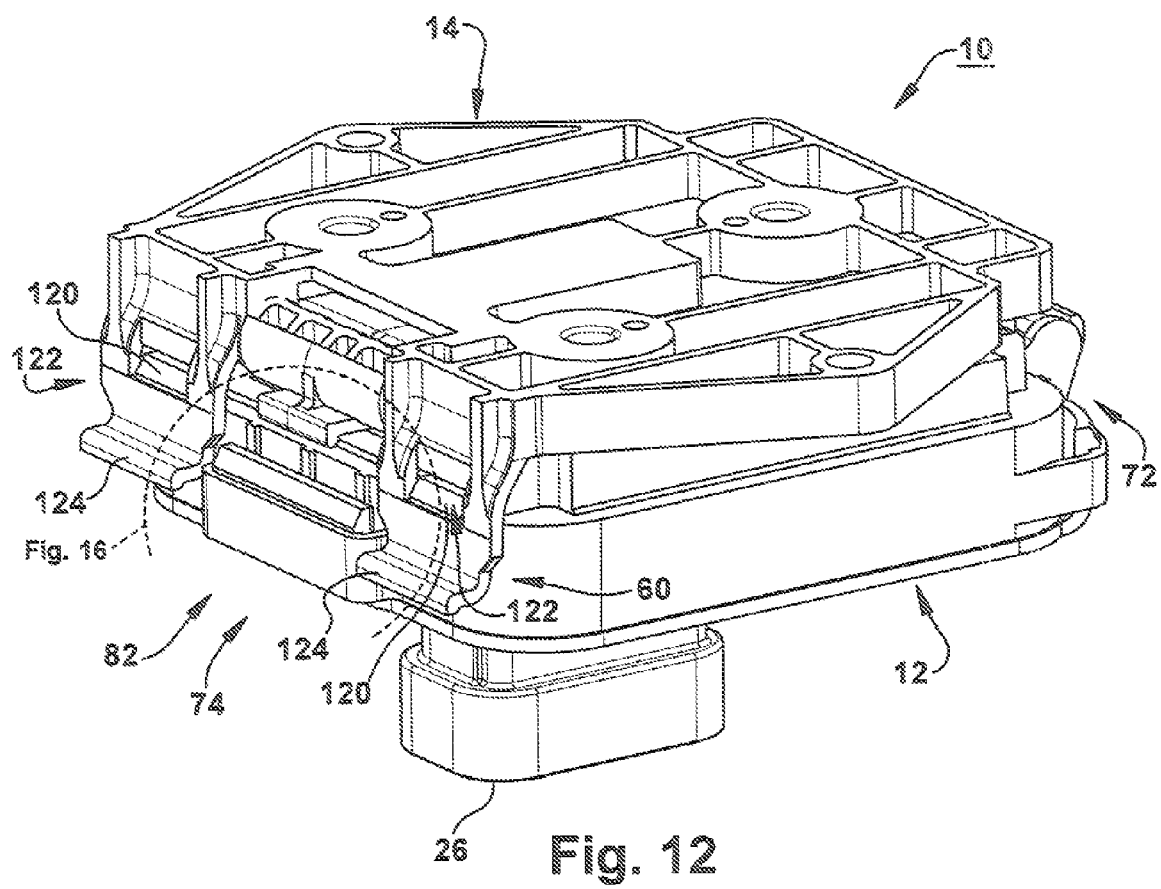
FIG. 12 is a perspective bottom view of a connection assembly and apparatus constructed in accordance with one example embodiment of the present disclosure.
Figure 13:
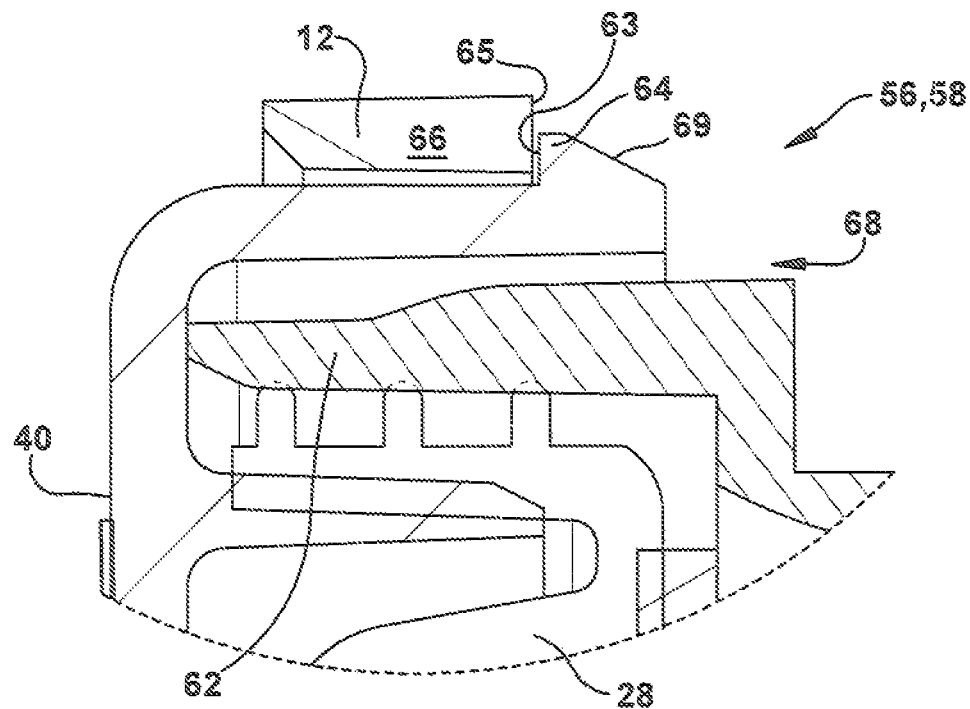
FIG. 13 is a magnified view of a portion of the example embodiment shown in FIG. 4.
Figure 16:
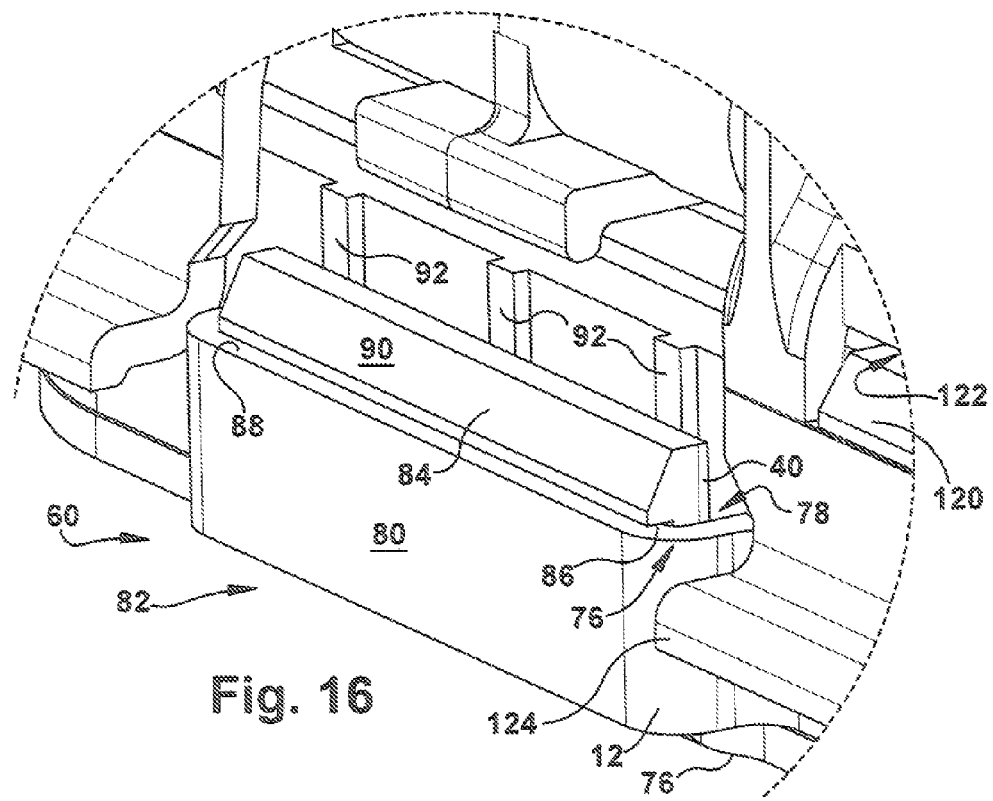
FIG. 16 is a magnified view of a portion of the example embodiment shown in FIG. 12.
Figure 17:
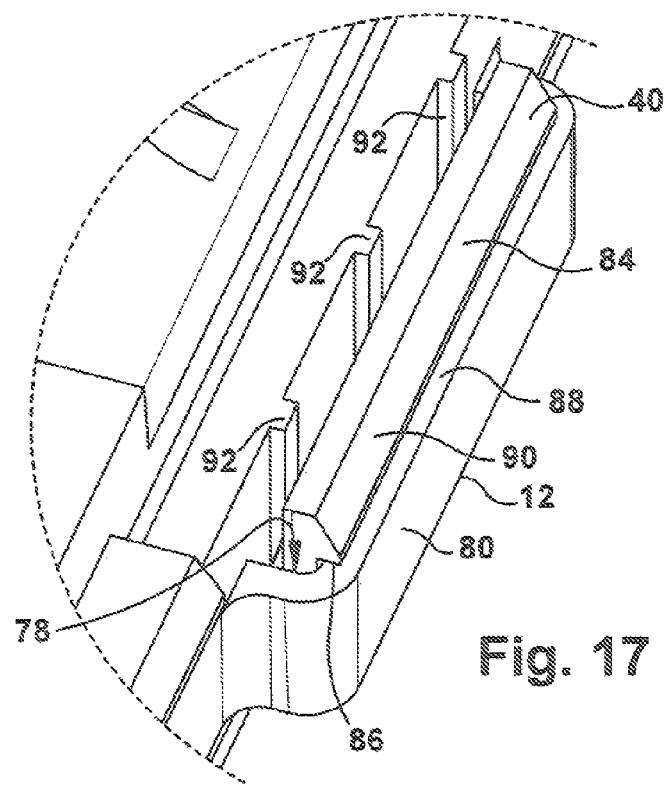
FIG. 17 is a magnified second perspective view of a connector cover attached to a housing of a connection assembly and apparatus as illustrated in the example embodiment of FIG. 16.
Figure 18:
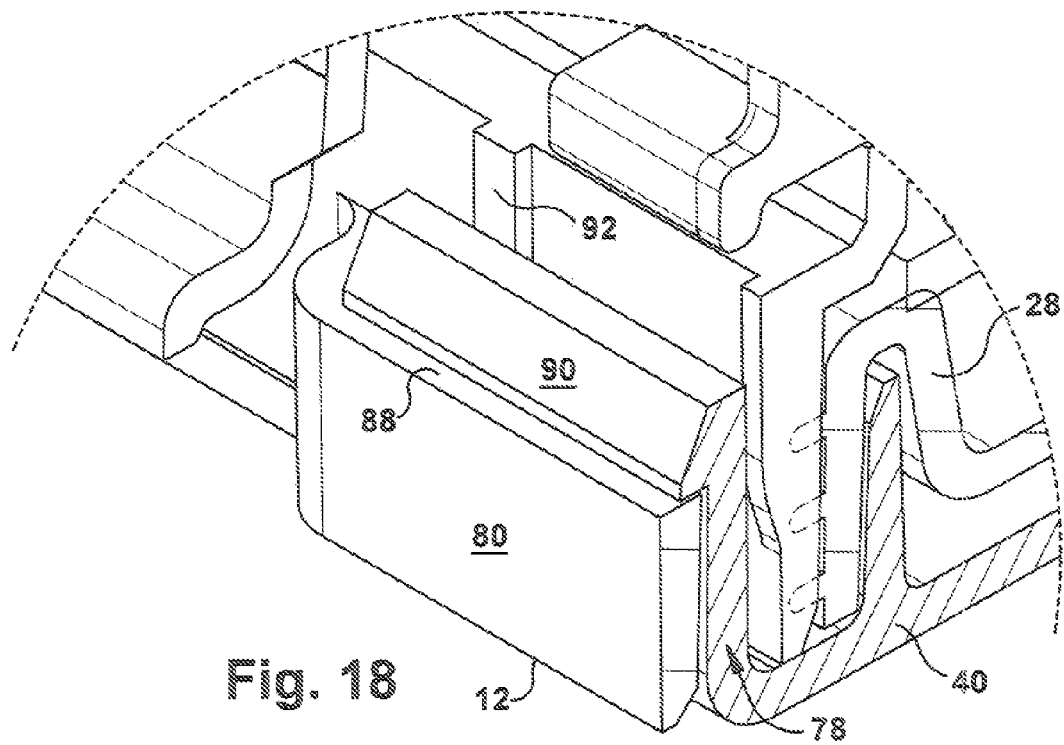
FIG. 18 is a magnified perspective view of a portion of the example embodiment shown in FIG. 4.

Turning now to the edge snap arrangement 60 illustrated in FIGS. 12 and 16, the edge snap arrangement comprises a leg 76 of the connector cover 40 curving up through and into a slot 78 formed by a ridge 80 of the housing 12 along the rear perimeter 82 at a rear end 74 of the connection assembly 10. Disposed along the distal end of the leg 76 is a pawl 84 that locks the leg within the slot 78. The locking condition is achieved by a limb 86 passing over an edge 88 of the slot 78. Similar to the construction of the corner snap arrangements, 56 and 58, the thickness of the pawl 84 is greater than the opening formed by the slot 78, facilitating the locking arrangement illustrated in FIG. 16. Advancement of the leg 76 and pawl 84 during insertion into the slot 78 is assisted by an inclined plane 90 surrounding the pawl.

During use, the latching assemblies 50 collectively attach the housing 12 to the connector cover 40. In one example embodiment, the connector cover 40 is formed from generally plastic and more specifically a thermoplastic material. However, equivalent materials of similar strength and/or weight could be used without departing from the spirit and scope of the present disclosure.

Integrated in and projecting from the housing 12 within and extending beyond both sides of slots 68 and 78 are one or more ribs 92. In the illustrated example embodiment, the one or more ribs 92 are formed from plastic and molded with and into the housing 12.

The one or more ribs 92 reside behind legs 62 and 76 when the housing 12 and connector cover 40 are secured together. The ribs 92 ensure that the latching assemblies 50 are secured together and will not loosen within the connection assembly 10 as a result of use or vibration in the power equipment. Additionally, if the legs 62 and/or 76 become warped due to processing, the ribs 92 will aid in positioning of the legs in the proper location to be secured and retain the locked position of FIGS. 13-16.

When the connection assembly 10 is in a latched position, that is the housing 12 is latched with the mount plate 14, tabs 120 located on the housing pass through openings 122 (as best seen in FIGS. 12 and 16). The latched position between the housing 12 and mount plate 14 is released by pulling away release catches 124 attached to the mount plate away from the tabs 120. In one example embodiment, the release from the latched position between the housing 12 and mount plate 14 as shown in of FIGS. 12 and 16 is achieved without tools, by using for example an operator's thumb or fingers and depressing the release catches 124 away from the housing.

The ribs 92 in the locked position of FIGS. 13-16 require tools for disassembly. This prevents any concealed tampering, that is, the connection assembly 10, and more particularly the connector cover 40 is incapable of being disassembled from the housing 12 without tools. In the event that tools are used to open or separate the connector cover 40 from the housing 12, witness marks and damage to the cover or housing will result on the components, indicating that the connection assembly 10 was tampered with or disassembled.

Figure 4:
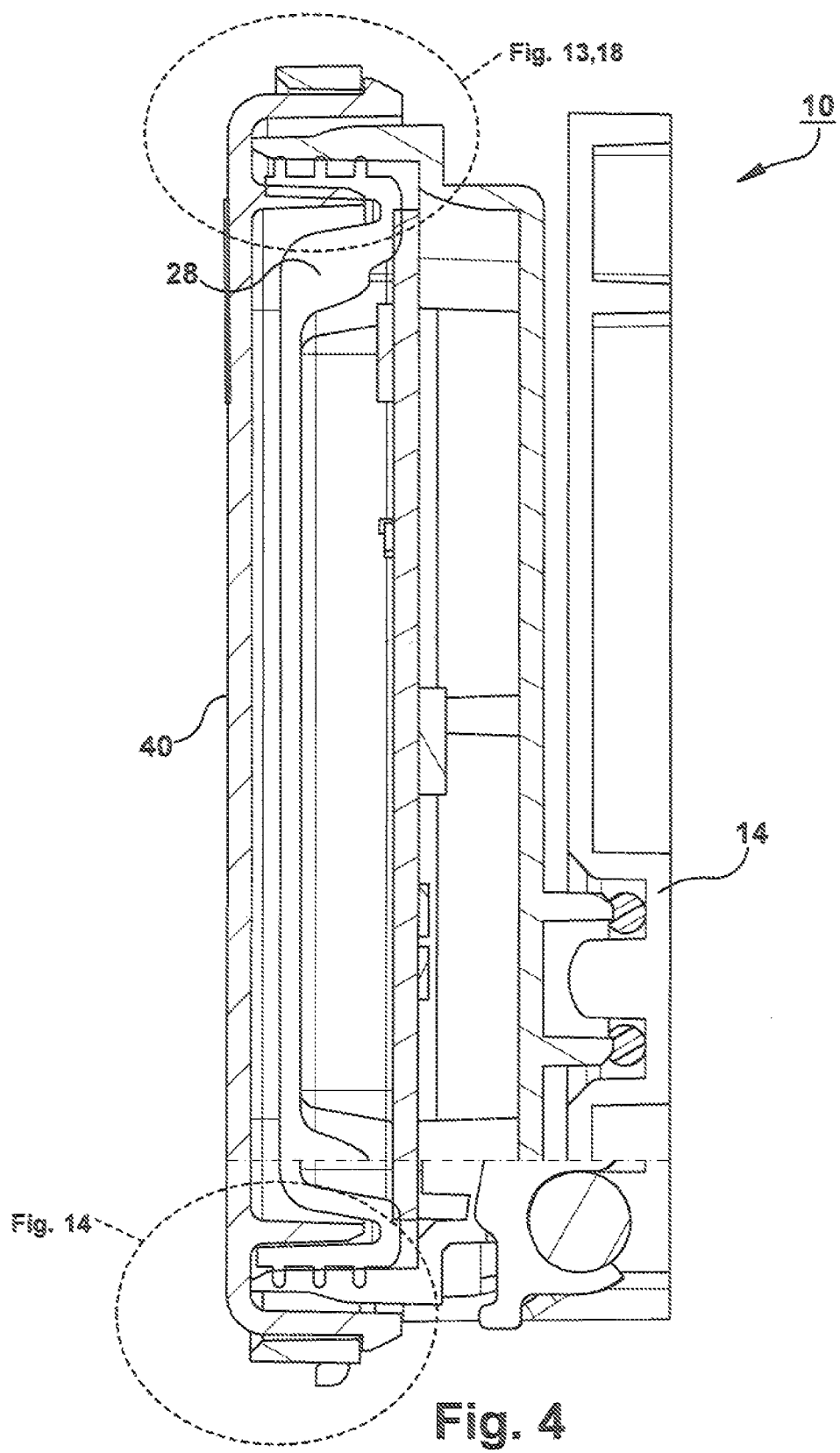
FIG. 4 is an elevated section view of the connection assembly of the example embodiment of FIG. 3 along section lines 4-4.
Figure 5:
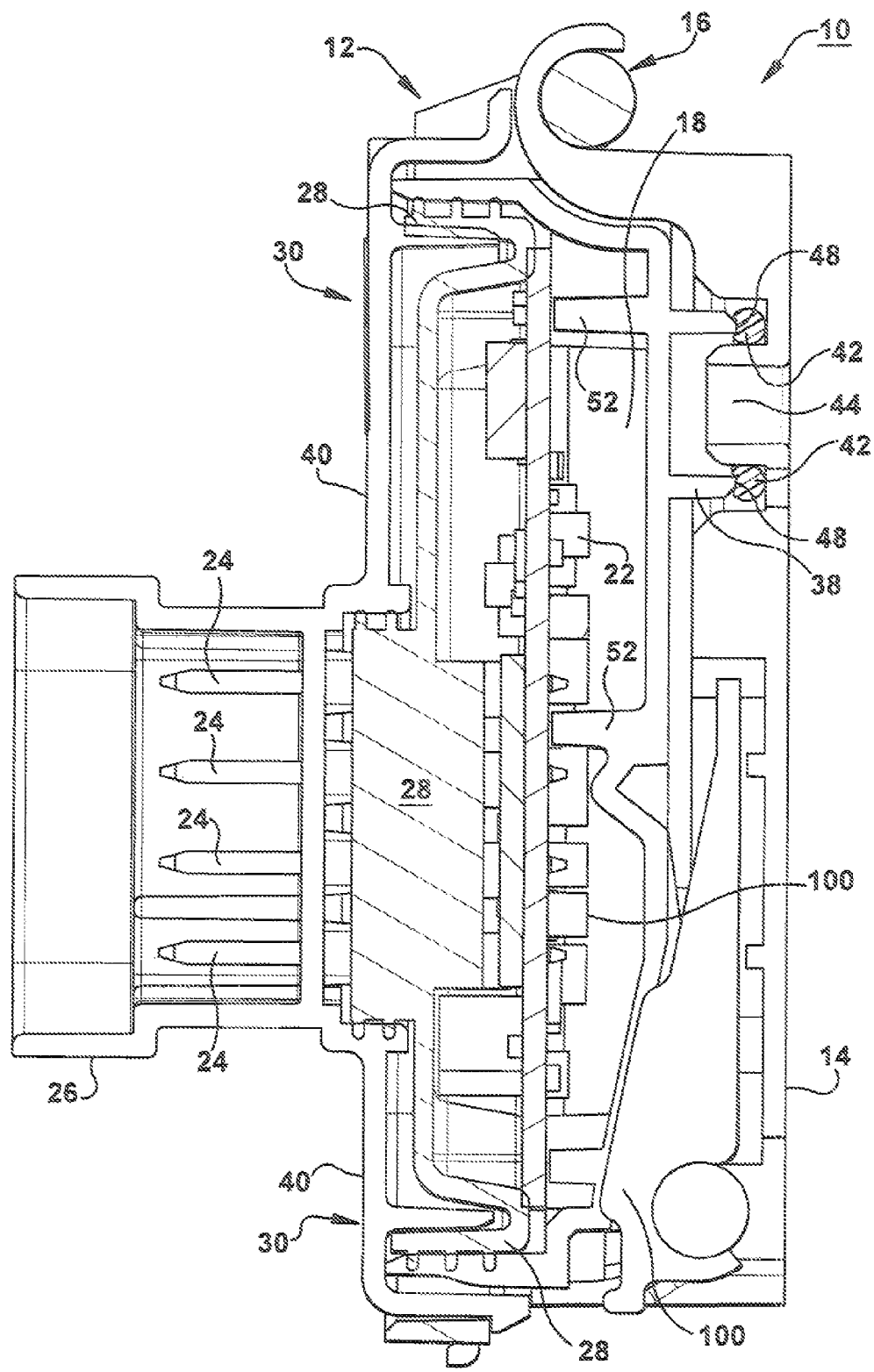
FIG. 5 is a section view of the connection assembly of the example embodiment of FIG. 3 along section lines 5-5.
Figure 6:
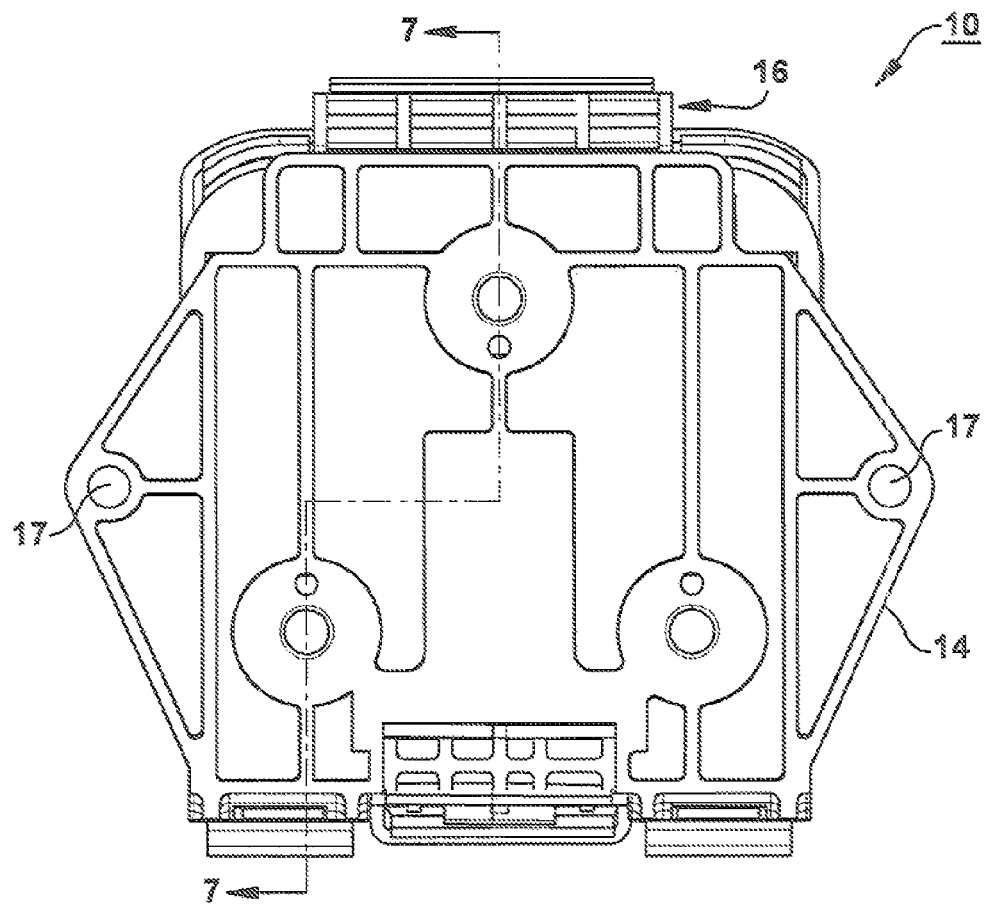
FIG. 6 is a lower plan view of a connection assembly and apparatus constructed in accordance with one example embodiment of the present disclosure.
Figure 19:
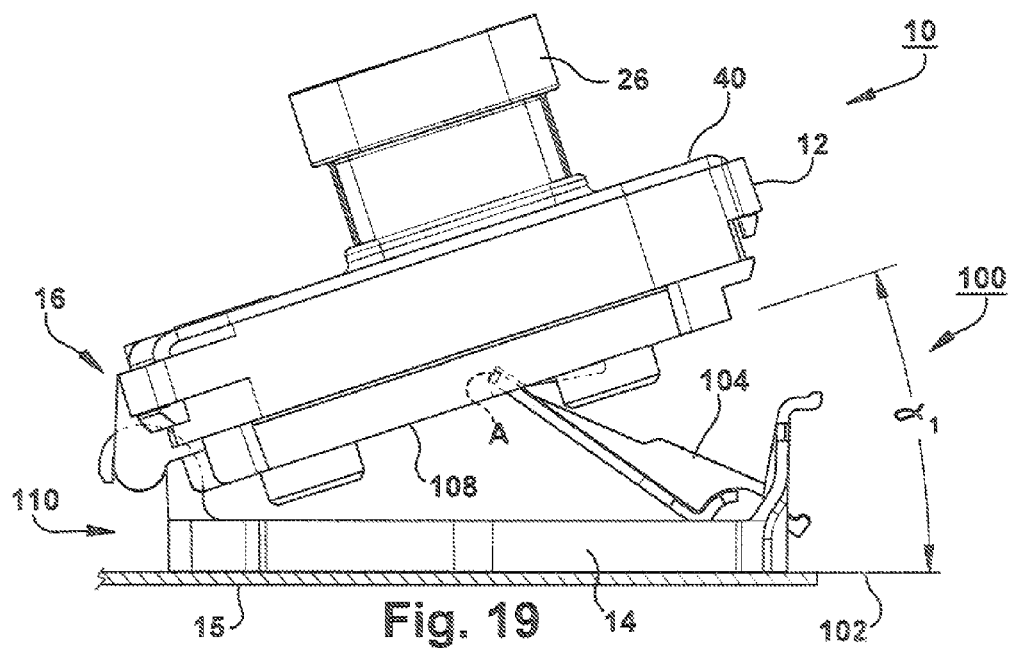
FIG. 19 is an elevation view of the connection assembly rotated to a first calibration position.
Figure 20:
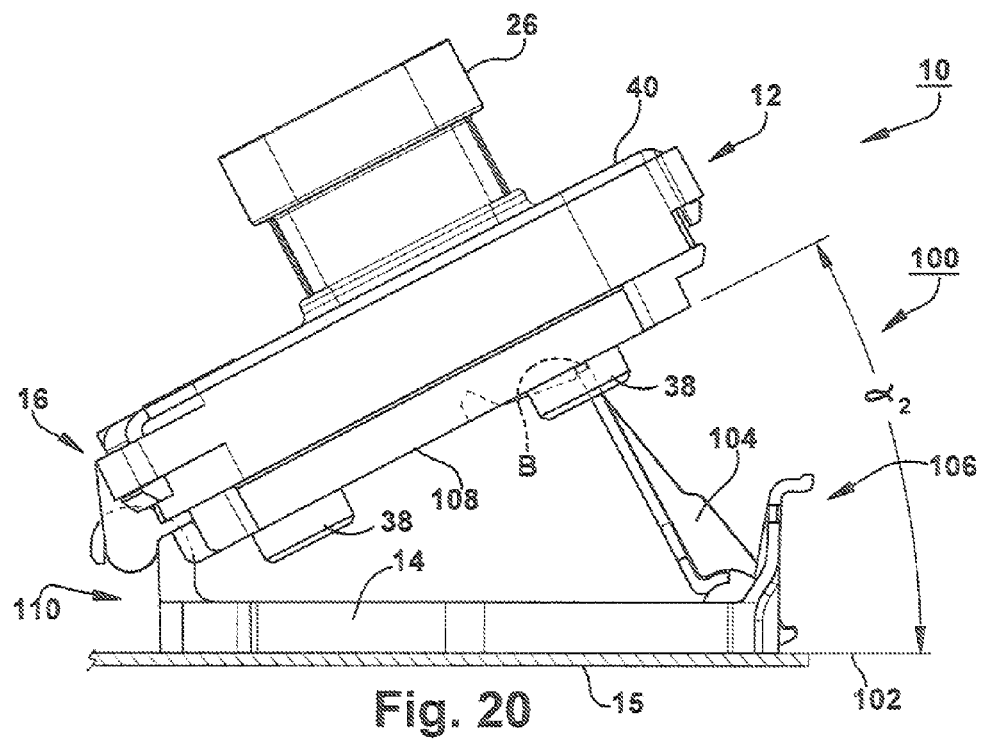
FIG. 20 is an elevation view of the connection assembly rotated to a second calibration position.
Figure 21:
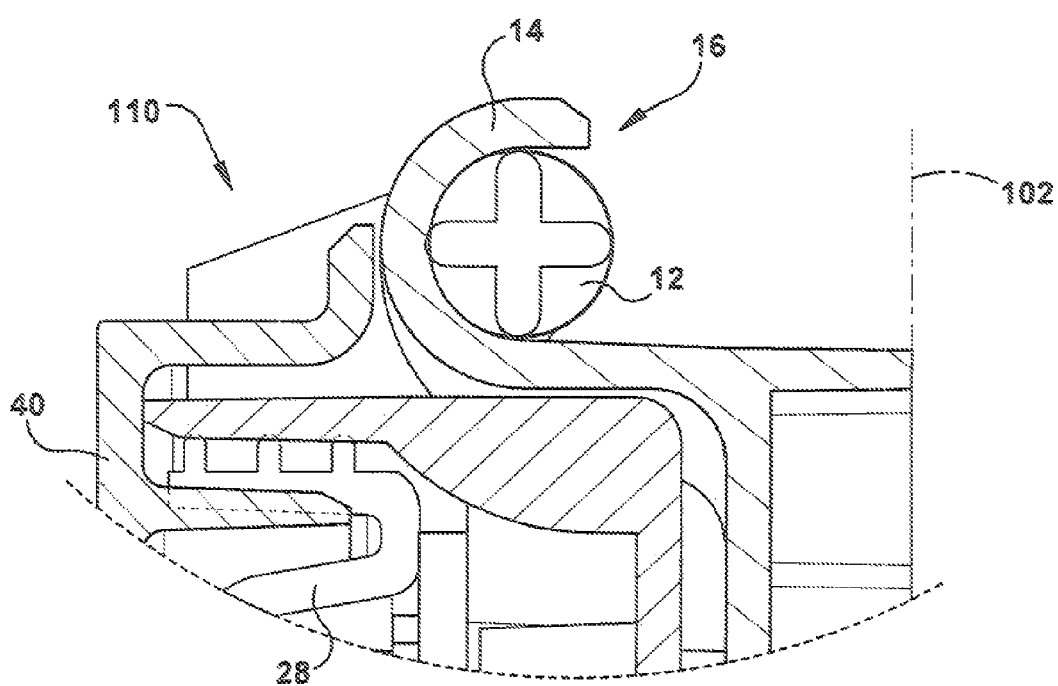
FIG. 21 is magnified sectional view of a hinge pin assembly as illustrated in a portion of the example embodiment of FIG. 9.

In one example embodiment, the electronics 22 located within the cavity 18 comprises a tilt sensing device 100 such as an accelerometer as further described in the '722 Application. The tilt sensing device 100, as illustrated in FIGS. 4 and 5 as well as other electronics 22 may require calibration. As a result, the calibration creates a need to rotate or orient the housing 12, connector cover 40, and electronics 22 at different angles, for example $\alpha_1$ and $\alpha_2$ as illustrated in FIGS. 19 and 20 from a plane 102 extending from the attachment point 15.

Figure 22:
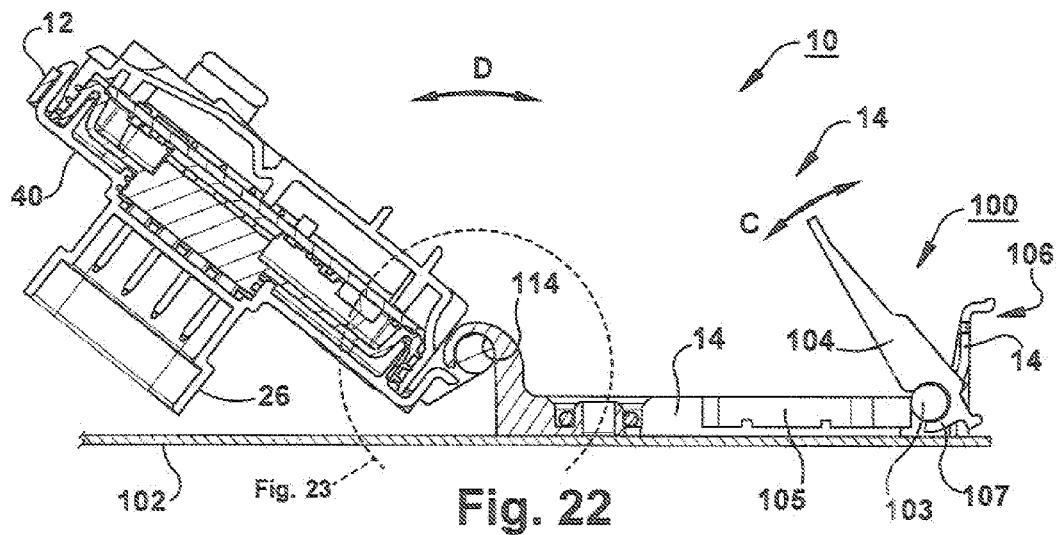
FIG. 22 is a sectioned elevation view of a connection assembly in an opened position.
Figure 23:
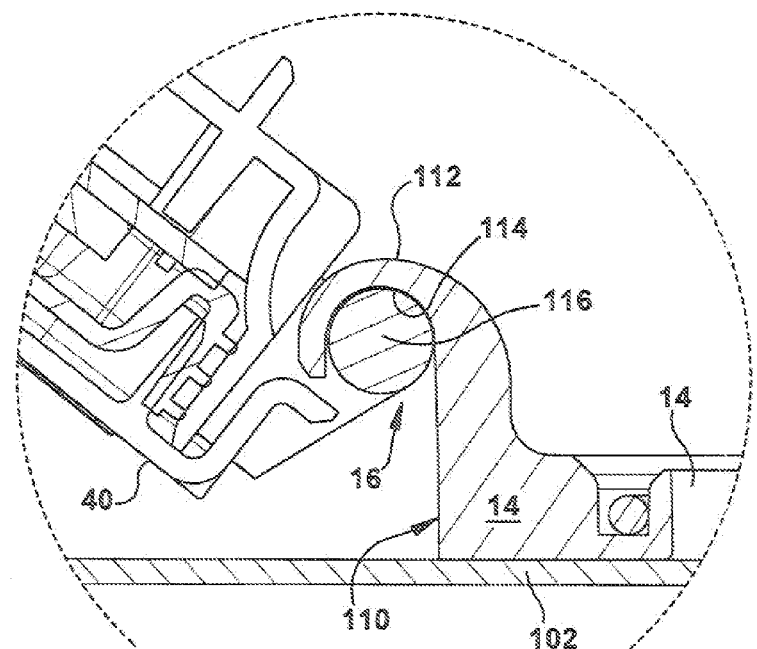
FIG. 23 is magnified sectional view of a hinge pin assembly as illustrated in the example embodiment of FIG. 22.
Figure 24:
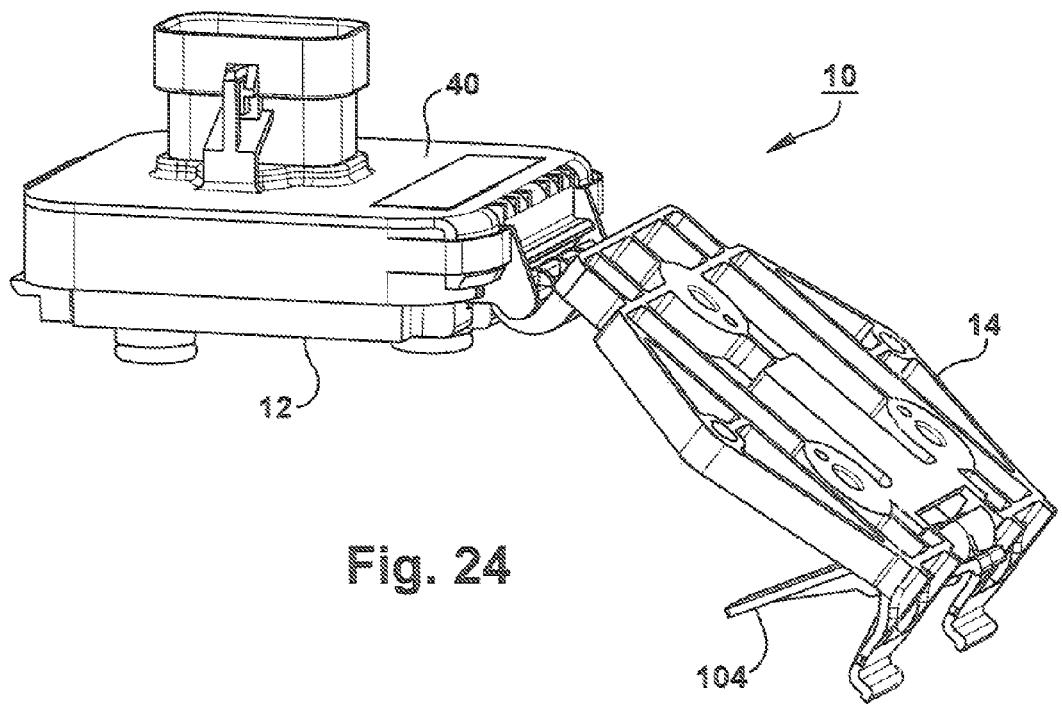
FIG. 24 is a perspective view of a connection assembly in an opened position.

Such calibration angles $\alpha_1$ and $\alpha_2$ can be conveniently determined by a gage 104 rotatably connected to a cylindrical hinge 103 integrated into and molded at a front end 106 of the mount plate 14, as seen in FIG. 22. The gage 104 rotates to a designated point or points (A and B see FIG. 2) along a bottom surface 108 of the connector cover 40. For example calibration points A and B (illustrated in FIGS. 2, 19 and 20) are known and designated points that once contacted or engaged by the gage 104, a prescribed angle of the electronics 22 is calibrated by internal or external conditioning, such as pin connectors, firmware, switches, or communication interfaces or ports as would be appreciated by one skilled in the art.

As illustrated in FIG. 2, point A is a recessed area for receipt of an end of the gage 104 (see FIG. 19) and point B is an abutment for the resting of the gage (see FIG. 20), both of which known calibration points A and B are molded into the housing 12. It should be appreciated that while only two calibration points are being shown (A and B), an unlimited number of calibration positions and/or points are intended to be within the scope and claims of the present disclosure.

By allowing the tilting of the housing 12 and tilt sensor 100 relative to the mounting plate 14 (as shown by arrows D in FIG. 22, the power equipment or vehicle advantageously can remain stationary during calibration and/or testing procedures of the electronics 22 and/or tilt sensor 100. This eliminates the need to tilt the power equipment or vehicle to a known incline angle during calibration and/or testing procedures of the electronics 22 and/or tilt sensor 100. Instead, the power equipment or vehicle electronics and/or tilt sensor can be tested while they are positioned on a horizontal plane.

In one embodiment, the gage 104 is made from plastic or a thermoplastic material. The gage 104 further comprises a linear hook 107 that snaps onto the cylindrical hinge 103 for relative rotational movement about the hinge in the direction of arrows C as seen in FIG. 22. When in a closed or locked position, the gage 104 resides within a pocket 105 (see FIGS. 2 and 22) of the mounting plate 14 of the connection assembly 10.

Also facilitating the rotation of the housing 12 and connector cover 40 for the calibration of the electronics 22 and/or tilt sensor 100 therein is the hinge pin assembly 16 disposed at a rear end 110 of the mount plate 14, as seen in FIGS. 4, 5 and 19-24. The hinge pin assembly 16 comprises an arcuate catch 112 that includes a hook 114 both of which are molded in the mount plate 14. The hook 114 of the arcuate catch 112 surrounds a cylindrical pin 116 molded into the housing 12. In the illustrated example embodiment, the hinge pin assembly 16 is fully molded or integrated into the plastic of either the mount plate 14 or housing 12 as described above and illustrated in the figures.

Another advancement of the present disclosure used to mitigate the concealed tampering conditions is the hinge pin assembly's 16 design and positioning on the connection assembly 10 when attached to the power equipment. More specifically, the hinge pin assembly 16 design and positioning precludes the disassembly from the mount plate 14 when the connection assembly 10 is secured to a substantially flat surface as illustrated in FIG. 22. That is, housing 12 cannot rotate 180 degrees, which is the minimum amount required for disassembly of the housing and mount plate 14 at the hinge pin assembly 16. Therefore, the hinge pin assembly 16 must be assembled prior to the securing of the mount plate 14 to the surface or attachment point 15 of the power equipment.

What have been described above are examples of the present invention. It is, of course, not possible to describe every conceivable combination of components or methodologies for purposes of describing the present invention, but one of ordinary skill in the art will recognize that many further combinations and permutations of the present invention are possible. Accordingly, the present invention is intended to embrace all such alterations, modifications, and variations that fall within the spirit and scope of the appended claims.

What is claimed is:

1. A connection assembly for securing electrical components used with power equipment comprising:
   a housing and a connector cover forming an upper arrangement of said connection assembly, the housing and connector cover creating a cavity therebetween for supporting electronics;
   a lower arrangement used to secure the connection assembly to a power equipment device; and
   a hinge assembly forming a rotational connection between said upper arrangement and said lower arrangement.

2. The connection assembly of claim 1 further comprising an isolation assembly formed between said upper arrangement and said lower arrangement, the isolation assembly reducing vibration to the connection assembly.

3. The connection assembly of claim 1 further comprising latching assemblies between said housing and said connector cover, the latching assemblies reducing vibrational unlatching of the housing and the connector cover.

4. The connector assembly of claim 3 further comprising one or more ribs disposed within said latching assembly to reduce vibrational unlatching or tampering of the housing and connector cover.

5. The connector assembly of claim 1 further comprising a mechanical gage for calibrating electronics disposed within said cavity at prescribed rotational angles about said hinge assembly, the mechanical gage being rotatably connected to said lower arrangement at first end of said connector assembly, the connector assembly having a second end opposite said first end, said hinge assembly being rotatably coupled in said connection between said upper arrangement and said lower arrangement at said second end.

6. The connector assembly of claim 5 wherein said upper arrangement's maximum rotation about the hinge assembly is less than a prescribed tampering angle, preventing the disassembly of the lower arrangement from the upper arrangement once the connector assembly is secured to a power equipment device.

7. A connector assembly for use with a power equipment device, the connector assembly comprising:
- an upper arrangement comprising a housing having a cavity for supporting electronics;
- a lower arrangement for securing the connector assembly to a surface on a power equipment device;
- a hinge assembly forming a rotational connection between said upper arrangement and said lower arrangement; and
- an isolation assembly formed between said upper arrangement and lower arrangement such that when said upper arrangement and lower arrangement are rotated by said hinge assembly to a closed position, the isolation assembly is in solid contact between the upper and lower arrangements.

8. The connector assembly of claim 7 wherein said isolation assembly comprises at least one annular projection surrounded by a damper extending from one of said upper and lower arrangements and a boss for contacting said damper, the boss extending from the other of said upper and lower arrangements.

9. The connector assembly of claim 7 further comprising at least one latching assembly for securing a housing and a connector cover that form the upper arrangement.

10. The connector assembly of claim 9 wherein said latching assembly further comprises at least one snap arrangement formed by a leg extending from one of said connector cover and housing and a slot for receiving said leg formed in the other of said connector cover and housing.

11. The connector assembly of claim 10 wherein said snap arrangement is an arcuate snap arrangement located on an arcuate perimeter of said upper arrangement such that said leg is a double arcuate leg and said slot for receiving said leg is an arcuate slot.

12. The connector assembly of claim 10 wherein said snap arrangement is a linear snap arrangement located on a linear perimeter of said upper arrangement such that said linear perimeter is parallel with said slot for receiving said leg.

13. The connector assembly of claim 11 further comprising a linear snap arrangement located on a linear perimeter of said upper arrangement such that said linear perimeter is parallel with said slot for receiving said leg.

14. The connector assembly of claim 10 wherein said snap arrangement has an opening formed by said slot, the opening being smaller than the thickness of the leg passing through the slot opening such that a press-fit anti-tampering connection is achieved between the connector cover and housing.

15. The connector assembly of claim 14 further comprising at least one rib extending away from said upper arrangement and toward said opening to engage said leg to facilitate said press-fit anti-tampering connection.

16. The connector assembly of claim 7 further comprising a calibration gage rotatably connected to one of said upper and lower arrangements for calibrating electronics disposed within said cavity at prescribed rotational angles about said hinge assembly.

17. The connector assembly of claim 16 wherein said calibration gage is positioned within a pocket located in one of said upper and lower arrangements when the connector assembly is in a closed position.

18. The connector assembly of claim 7 further comprising a seal located in the cavity of the upper arrangement, the seal allowing for the passage of electronics from the cavity to the exterior of the connector assembly, the seal constructed such to prevent moisture and/or debris from entering the cavity from the exterior of the connector assembly.

19. A connector assembly for use with lawn tractor, the connector assembly comprising:
- an upper arrangement comprising a housing and a connector cover having a cavity for supporting electronics;
- a lower arrangement for securing the connector assembly to a surface on a lawn tractor;
- a hinge assembly forming a rotational connection between said upper arrangement and said lower arrangement;
- an isolation assembly formed within said upper arrangement and lower arrangement such that when said upper arrangement and lower arrangement are rotated by said hinge assembly to a closed position, the isolation assembly generates solid contact between the upper and lower arrangements;
- the isolation assembly comprising at least one annular projection surrounded by a damper extending from said lower arrangement and a boss for contacting said damper extending from the said upper arrangement, the boss and damper being in contact when said upper and lower arrangements are rotated about said hinge assembly to a closed position, the isolation assembly forming a positive contact between the upper and lower arrangements when the connection assembly is in said closed position.

20. The connector assembly of claim 19 further comprising a plurality of isolation assemblies formed within said lower and upper arrangements.

* * * * *